United States Patent
Song et al.

(10) Patent No.: US 9,502,283 B2
(45) Date of Patent: Nov. 22, 2016

(54) ELECTRON-BEAM (E-BEAM) BASED SEMICONDUCTOR DEVICE FEATURES

(71) Applicant: QUALCOMM Incorporated, San Diego, CA (US)

(72) Inventors: Stanley Seungchul Song, San Diego, CA (US); Jeffrey Junhao Xu, San Diego, CA (US); Da Yang, San Diego, CA (US); Choh Fei Yeap, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 14/627,653

(22) Filed: Feb. 20, 2015

(65) Prior Publication Data

US 2016/0247714 A1    Aug. 25, 2016

(51) Int. Cl.
| | |
|---|---|
| H01L 21/768 | (2006.01) |
| G06F 17/50 | (2006.01) |
| H01L 21/311 | (2006.01) |
| H01L 23/535 | (2006.01) |
| G03F 1/00 | (2012.01) |
| G03F 7/20 | (2006.01) |

(52) U.S. Cl.
CPC ........... *H01L 21/76802* (2013.01); *G03F 1/14* (2013.01); *G03F 7/7045* (2013.01); *G03F 7/70425* (2013.01); *G03F 7/70433* (2013.01); *G03F 7/70466* (2013.01); *G06F 17/5077* (2013.01); *H01L 21/31116* (2013.01); *H01L 23/535* (2013.01)

(58) Field of Classification Search
CPC .................. H01L 21/76802; H01L 21/31116; H01L 23/535; G06F 17/5077; G03F 1/14; G03F 7/70425; G03F 7/70433; G03F 7/7045; G03F 7/70466

See application file for complete search history.

(56) References Cited

U.S. PATENT DOCUMENTS

| | | | |
|---|---|---|---|
| 6,875,624 B2 | 4/2005 | Lin | |
| 7,255,804 B2 | 8/2007 | Prather et al. | |
| 7,914,970 B2 | 3/2011 | Fuller et al. | |
| 2005/0020003 A1* | 1/2005 | Johansson | H01L 27/0635 438/207 |
| 2005/0074698 A1 | 4/2005 | Borodovsky | |
| 2009/0102501 A1* | 4/2009 | Guldi | G01R 31/2884 324/754.22 |
| 2009/0121159 A1 | 5/2009 | Hwang et al. | |
| 2010/0302520 A1 | 12/2010 | Hwang | |

OTHER PUBLICATIONS

Du, Yuelin et al., "Hybrid Lithography Optimization with E-Beam and Immersion Processes for 16nm 1D Gridded Design," 17th Asia and South Pacific Design Automation Conference (ASP-DAC), 2012, pp. 707-712.

(Continued)

*Primary Examiner* — Long Pham
(74) *Attorney, Agent, or Firm* — Toler Law Group, P.C.

(57) ABSTRACT

Electron-beam (e-beam) based semiconductor device features are disclosed. In a particular aspect, a method includes performing a first lithography process to fabricate a first set of cut pattern features on a semiconductor device. A distance of each feature of the first set of cut pattern features from the feature to an active area is greater than or equal to a threshold distance. The method further includes performing an electron-beam (e-beam) process to fabricate a second cut pattern feature on the semiconductor device. A second distance of the second cut pattern feature from the second cut pattern feature to the active area is less than or equal to the threshold distance.

30 Claims, 6 Drawing Sheets

(56) References Cited

OTHER PUBLICATIONS

Ghaida, Rani S. et al., "A Framework for Early and Systematic Evaluation of Design Rules," IEEE/ACM International Conference on Computer-Aided Design—Digest of Technical Papers, Nov. 2-5, 2009, pp. 615-622.

Lam, David K. et al., "E-Beam to Complement Optical Lithography for 1D Layouts," Proc. SPIE, Alternative Lithographic Technologies III, Apr. 4, 2011, vol. 7970, 8 pages.

Vogler, Debra, "Beyond 193i and Sub-22nm: Tackling the Cost and Technical Drivers," SEMICON, Retrieved from the Internet: http://www.semiconwest.org/node/9856, Retrieved on Oct. 31, 2014, 4 pages.

David L. K. et al., "E-beam to Complement Optical Lithography for 1D Layouts," Alternative Lithographic Technologies III, SPIE, 1000 20th St, Bellingham Wa 98225-6705 USA, vol. 7970, No. 1, Mar. 17, 2011 (Mar. 17, 2011), pp. 1-8, XP060008680, DOI: 10.1117/12.879479 [retrieved on Apr. 4, 2011].

International Search Report and Written Opinion—PCT/US2016/017936—ISA/EPO—Jun. 30, 2016, 13 pages.

* cited by examiner

ELECTRON-BEAM (E-BEAM) BASED SEMICONDUCTOR DEVICE FEATURES

I. FIELD

The present disclosure is generally related to electron-beam (e-beam) based semiconductor device features.

II. DESCRIPTION OF RELATED ART

During manufacturing of integrated circuits (ICs), a 193 nanometer (nm) immersion lithography (193i) process (e.g., an optical lithography technique) may be used to pattern multiple features of a semiconductor device. The multiple features may be formed on different layers of the semiconductor device. For example, a line and space pattern may be formed on a first layer of the semiconductor device. Additionally, the 193i process may be used to apply one or more cut patterns to the line and space pattern and/or to form one or more other features, such as vias, active areas (e.g., metal lines), contacts, etc., above the line and space pattern. To form the one or more other features, different color cut patterns and/or different color block patterns may be applied to the semiconductor device. Each cut pattern and/or block pattern uses a different mask, which increases a cost and an amount of time to produce the semiconductor device.

III. SUMMARY

The present disclosure describes a semiconductor device having one or more semiconductor device features formed using an electron-beam (e-beam) process (e.g., a direct write e-beam process). The semiconductor device may include other semiconductor device features formed using one or more optical lithography processes, such as the 193i lithography process or an extreme ultraviolet lithography (EUV) process. The e-beam lithography process may have a higher resolution (e.g., smaller margins) than the one or more optical lithography processes. However, the e-beam process may be more time consuming (e.g., have a lower throughput) than the one or more optical lithography processes, such as the 193i process. Accordingly, using the e-beam process in combination with the one or more optical lithography processes to form the features of the semiconductor device may result in a semiconductor device with a smaller footprint (e.g., smaller layout dimensions) and may use a fewer number of masks as compared to forming the semiconductor device without using the e-beam process.

The features of the semiconductor device formed using the e-beam process may be identified according to design rules (e.g., one or more thresholds) applied during a layout design phase of the semiconductor device. To illustrate, a first layout design of the semiconductor device may include a plurality of cut pattern features associated with a first lithography process, such as an optical lithography process (e.g., the 193i process). A layout design device, such as a computer that has a processor and a memory, may apply a set of design rules to the first layout design to generate a second layout design that is more compact (e.g., has a smaller footprint) than the first layout design. For example, the layout design device may apply the set of design rules to divide the plurality of cut pattern features into a first set of cut pattern features associated with the first lithography process and a second set of cut pattern features associated with the e-beam process. To illustrate, the set of design rules may include one or more thresholds to identify at least one feature based on a distance (e.g., a lateral distance, a height distance, or a diagonal distance) of the at least one feature from an active area (e.g., a diffusion area corresponding to a source, a drain, or a channel of a transistor), a distance of the at least one feature from a via, an angle between two edges of the at least one feature, or a combination thereof, as illustrative, non-limiting examples. A lateral distance may be a horizontal distance between two different features on the same layer or on different vertical layers of the semiconductor device. A height distance may be a vertical distance between two different features on different vertical layers of the semiconductor device. A diagonal distance may be a direct (e.g., a shortest) distance between two different features on the same layer or on different vertical layers of the semiconductor device.

The layout design device may generate a second layout design such that the plurality of cut pattern features of the first layout design are divided into a first set of cut pattern features associated with the first lithography process and a second set of cut pattern features (e.g., features identified using the set of design rules) associated with the e-beam process. For example, the layout design device may generate the second layout design such that each of the second set of cut pattern features is spaced using first margins corresponding to the first lithography process and each of the second set of cut pattern features is spaced using second margins corresponding to the e-beam process. A fabrication system may use a combination of the e-beam process and the first lithography process (e.g., an optical lithography process) to generate a patterned semiconductor device based on the second layout design.

In some implementations, a first lithography process (e.g., an optical lithography process, such as the 193i lithography process or the EUV process) may be used to fabricate a first cut pattern corresponding to a first feature of a semiconductor device and the e-beam lithography process may be used to fabricate a second cut pattern corresponding to a second feature of the semiconductor device. Additionally or alternatively, the first lithography process may be used to form a first block pattern corresponding to a first feature of the semiconductor device and the e-beam lithography process may be used to form a second block pattern corresponding to a second block feature of the semiconductor device.

In a particular aspect, a method includes performing a first lithography process to fabricate a first set of cut pattern features on a semiconductor device. A distance of each feature of the first set of cut pattern features from the feature to an active area is greater than or equal to a threshold distance. The method further includes performing an electron-beam (e-beam) process to fabricate a second cut pattern feature on the semiconductor device. A second distance of the second cut pattern feature from the second cut pattern feature to the active area is less than or equal to the threshold distance.

In another particular aspect, a semiconductor device includes a first set of cut pattern features and a second cut pattern feature. The first set of cut pattern features is formed by a first lithography process. A distance of each feature of the first set of cut pattern features from the feature to an active area is equal to or greater than a threshold distance. The second cut pattern feature is formed by an electron-beam (e-beam) process. A second distance of the second cut pattern feature from the second cut pattern feature to the active area is less than or equal to the threshold distance.

In another particular aspect, a computer-readable storage device stores instructions that, when executed by a processor, cause the processor to perform operations including initiating a first lithography process to fabricate a first set of cut pattern features on the semiconductor device. A distance of each feature of the first set of cut pattern features from the feature to an active area is greater than or equal to a threshold distance. The operations may further include initiating an electron-beam (e-beam) process to fabricate a second cut pattern feature on the semiconductor device. A second distance of the second cut pattern feature from the second cut pattern feature to the active area is less than or equal to the threshold distance.

In another particular aspect, a method includes receiving a first semiconductor layout design including a plurality of cut pattern features associated with a first lithography process. The method also includes applying a set of design rules to the first semiconductor layout design to identify a first set of cut pattern features and a second set of cut pattern features of the plurality of cut pattern features. The method further includes generating a second semiconductor layout design based on the first semiconductor layout design. The second semiconductor layout design includes the first set of cut pattern features associated with the first lithography process and the second set of cut pattern features associated with an electron-beam (e-beam) process.

One particular advantage provided by at least one of the disclosed embodiments is a semiconductor device formed using a combination of an e-beam process and one or more optical lithography processes. Forming the semiconductor device using the combination may use a fewer number of masks as compared to forming the semiconductor device without using the e-beam process. Additionally, forming the semiconductor device using the combination results in the semiconductor device having a reduced footprint (e.g., reduced overall dimensions) as compared to forming the semiconductor device without using the e-beam process. Accordingly, using the combination of the e-beam process and the one or more optical lithography processes may decrease a cost and an amount of time to produce the semiconductor device as compared to forming the semiconductor device without using the e-beam process.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

FIG. 1 is a diagram of a particular illustrative embodiment of a semiconductor device having a first set of cut pattern features and a second set of cut pattern features.

FIG. 2 includes diagrams to illustrate a U-shaped active area formed using an electron beam (e-beam) process;

FIG. 3 includes diagrams to illustrate contacts formed using an e-beam process;

V. DETAILED DESCRIPTION

Particular embodiments of the present disclosure are described below with reference to the drawings. In the description, common features are designated by common reference numbers.

Figure 1:
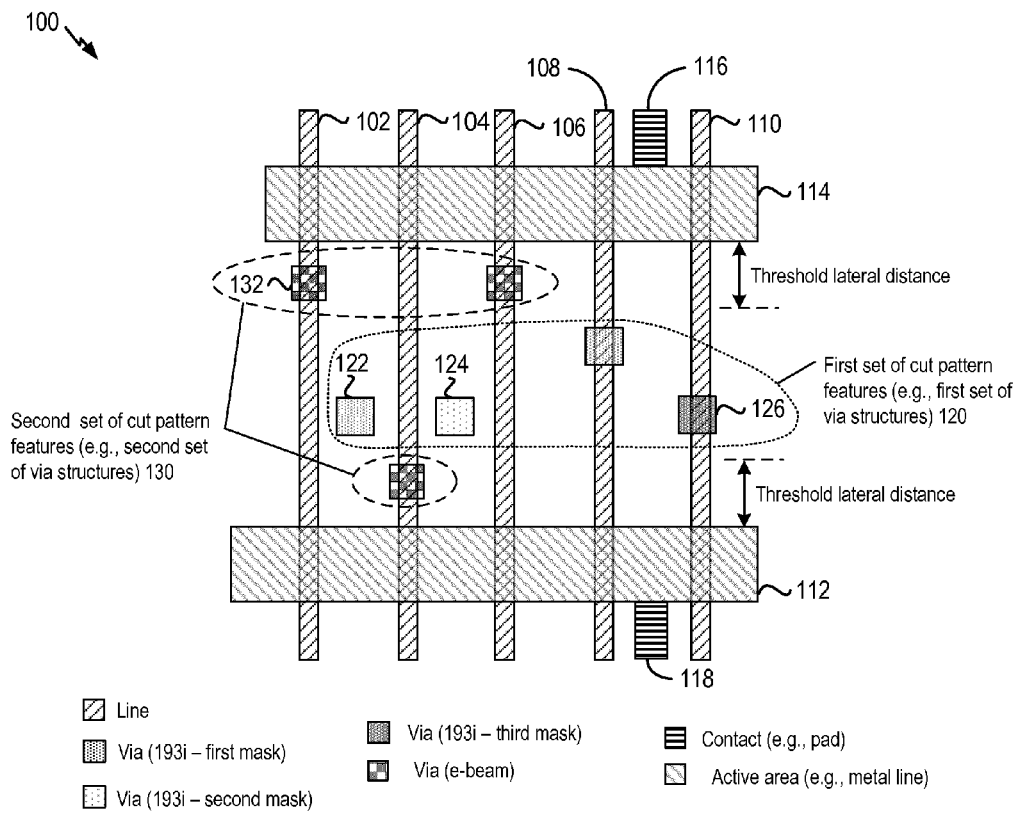
Figure 1:
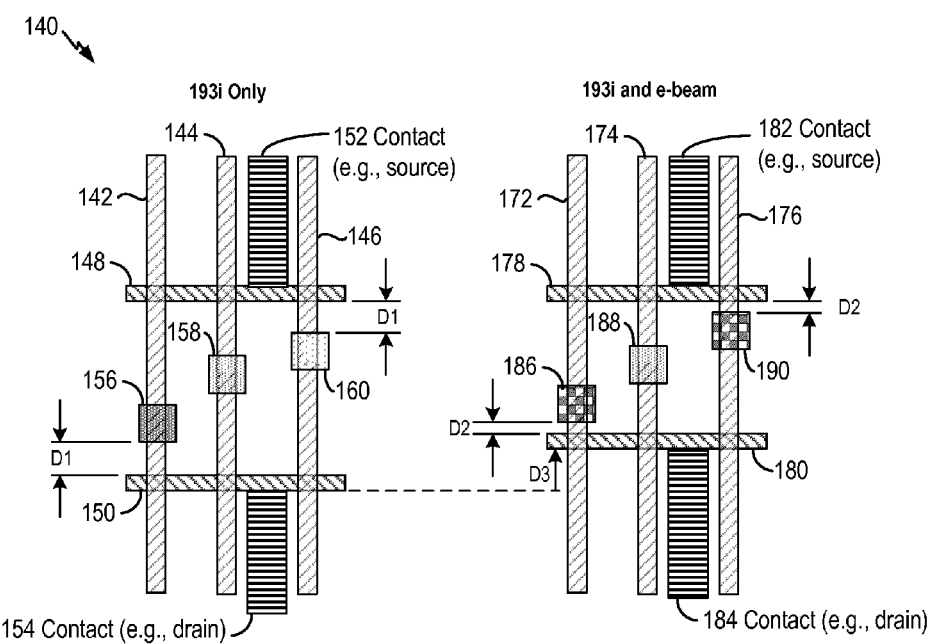

Referring to FIG. 1, an embodiment of a semiconductor device is illustrated and generally designated 100. The semiconductor device 100 (e.g., a silicon-based device) may be formed on and/or included in a wafer (not shown) that includes multiple layers, such as multiple vertically stacked dielectric layers. The semiconductor device 100 may include multiple cut pattern features that are formed on and/or through one or more layers of the multiple layers of the semiconductor device 100.

The multiple cut pattern features may include lines 102-110, active areas 112-114, contacts 116-118, and via structures 122-126 and 132. The lines 102-110 (e.g., metal lines) may include or correspond to a line and space pattern, such as a one dimensional (1D) line and space pattern. The lines 102-110 (e.g., the line and space pattern) may be formed on a first layer of the wafer (or a chip) using a first lithography process, such as an optical lithography process. The optical lithography process may include a 193 nanometer (nm) immersion (193i) process or an extreme ultraviolet (EUV) process. To illustrate, the lines 102-110 may be formed using the 193i process which uses spacer based multiple patterning to pattern the line and space pattern, as an illustrative, non-limiting example. The 193i process may have a higher throughput and a lower resolution than the EUV process and an electron-beam (e-beam) process. Although the semiconductor device 100 is illustrated as having five lines, in other implementations, the semiconductor device 100 may include more than or fewer than five lines.

The active areas 112-114 (e.g., diffusion areas corresponding to sources, drains, or channels of one or more transistors) may include a first active area 112 and a second active area 114. The active areas 112-114 may be formed on a second layer of the wafer (or the chip). Although the semiconductor device 100 is illustrated as having two active areas, in other implementations, the semiconductor device 100 may include more than two or less than two active areas. Each of the active areas 112-114 may be formed using the first lithography process (e.g., the optical lithography process), an electron beam (e-beam) process (e.g., a direct write process), or a combination thereof. For example, the active areas 112-114 may be formed using a combination of the first lithography process and the e-beam process, as described with reference to FIG. 2. The e-beam process may be a higher resolution process than the first lithography process. The active areas 112-114 may be formed on a second layer of the wafer (or chip), such as a second layer that is distinct from the first layer. In some implementations, the first active area 112 and the second active area 114 may be on the same layer of the wafer (or chip). In other implementations, the first active area 112 and the second active area 114 may be on different layers of the wafer (or the chip).

Each of the active areas 112-114 may be coupled to one or more contacts. For example, the first active area 112 may be coupled to a first contact 118 and the second active area 114 may be coupled to a second contact 116. To illustrate, the first active area 112 may be in contact (e.g., physically contact) with the first contact 118 and the second active area 114 may be in contact with the second contact 116. Each of the contacts 116-118 may be formed using the first lithography process (e.g., the optical lithography process) and/or an electron beam (e-beam) process (e.g., a direct write process). For example, the contacts 116-118 may be formed using the first lithography process or the e-beam process, as described with reference to FIG. 3. In some implementations, the contacts 116-118 may include pads (e.g., contact pads) that are formed on the same layer of the wafer (or chip) as the active areas 112-114. In other implementations, the contacts 116-118 may be formed on different layers of the wafer (or chip) as the active areas 116-118 (e.g., diffusion areas corresponding to sources, drains, and/or channels of one or more transistors). Although the semiconductor device 100 is illustrated as having two contacts, in other implementations, the semiconductor device 100 may include more than or less than two contacts.

The semiconductor device 100 may include a plurality of vias (e.g., via structures). For example, the plurality of via structures may include a first representative via structure 122, a second representative via structure 124, a third representative via structure 126, and a fourth representative via structure 132. The plurality of via structures may include a first set of via structures 120 and a second set of via structures 130. The first set of via structures 120 may correspond to a first set of cut pattern features formed using the first lithography process (e.g., the 193i process or the EUV process). For example, when the 193i process is used to form the first set of via structures 120, the first via structure 122 may be formed using a first mask (e.g., a first color mask), the second via structure 124 may be formed using a second mask (e.g., a second color mask), and the third via structure 126 may formed using a third mask (e.g., a third color mask). Although the first set of via structures 120 are described as being formed using three different masks, in other implementations, the first set of via structures 120 may be formed using more than or fewer than three masks. For example, the first set of via structures 120 may be formed using a single mask or using multiple masks. The second set of via structures 130 may correspond to a second set of cut pattern features formed using the e-beam process (or another process that is a higher resolution process than the first lithography process). The e-beam process may form the second set of via structures 130 (e.g., the second set of cut pattern features) using a single pass cut pattern process. Accordingly, the first set of via structures 120 may be formed using the first lithography process (e.g., the 193i process which has a higher throughput than the e-beam process) and the second set of via structures 130 may be formed using the e-beam process (e.g., the e-beam process which has a higher resolution than the 193i process).

Each via of the first set of via structures 120 (e.g., the first set of cut pattern features) may be associated with a corresponding first distance (e.g., a lateral distance, a height distance, or a diagonal distance) to an active area, such as the first active area 112 or the second active area 114. A lateral distance may be a horizontal distance between two different features on the same layer or on different vertical layers of the semiconductor device 100. A height distance may be a vertical distance between two different features on different vertical layers of the semiconductor device 100. A diagonal distance may be a direct (e.g., shortest) distance between two different features on the same layer or on different vertical layers of the semiconductor device 100.

Each corresponding first distance of the first set of via structures 120 may be greater than or equal to a threshold distance (e.g., a threshold lateral distance, a threshold height distance, or a threshold diagonal distance). The threshold distance may correspond to a spacing margin of the first lithography process. For example, when the first lithography process is the 193i process, the threshold distance may correspond to a minimum distance (e.g., a minimum lateral distance, a minimum height distance, and/or a minimum diagonal distance) that a cut pattern formed using the first lithography process is to be spaced from other features of the semiconductor device 100.

As an illustrative, non-limiting example, for a particular via structure of the first set of via structures 120, a corresponding first lateral distance may be a horizontal distance to a closest active area. To illustrate, the first lateral distance corresponding to the first via structure 122 may be a lateral distance from the first via structure 122 to the first active area 112. As another example, a first height distance of the first via structure 122 to the first active area 112 may be greater than or equal to the threshold height distance. As another example, a first diagonal distance of the first via structure 122 to the first active area may be greater than or equal to the threshold diagonal distance. Although the first set of via structures 120 are depicted as including four via structures, in other implementations, the first set of via structures 120 may include more than or fewer than four via structures.

Each via of the second set of via structures 130 (e.g., the second set of cut pattern features) may be associated with a corresponding second distance to an active area, such as the first active area 112 or the second active area 114. For a particular via structure of the second set of via structures 130, the corresponding second distance may be a distance to a closest active area. To illustrate, a second lateral distance corresponding to the fourth via structure 132 may be a lateral distance from the fourth via structure 132 to the second active area 114. Each corresponding second distance of the second set of via structures 130 may be less than or equal to the threshold distance (e.g., a threshold lateral distance, a threshold height distance, or a threshold diagonal distance). Although the second set of via structures 130 are depicted as including three via structures, in other implementations, the second set of via structures 130 may include more than or fewer than three via structures.

By having the first set of via structures 120 formed using the first lithography process and the second set of via structures 130 formed using the e-beam process, a footprint of the semiconductor device 100 may be reduced and a reduced number of color masks may be used as compared to a semiconductor device that includes the plurality of via structures (e.g., the first set of via structures and the second set of via structures) formed using the first lithography process. For example, a comparison of using the first lithography process (e.g., the 193i process) versus using the 193i process in combination with the e-beam process is depicted and generally designated 140.

Referring to the left illustration of the comparison 140, the 193i process is used to form a first version of a particular semiconductor device. Each semiconductor feature of the first version is formed using the 193i process. The first version includes lines 142-146, active areas 148-150 (e.g., metal lines), and contacts 152-154, such as a source contact 152 and a drain contact 154. The 193i process is also used to form cut patterns corresponding to via structures 156-160. For example, the via structures 156-160 may include a first via structure 156, a second via structure 158, and a third via structure 160. To form the via structures 156-160, multiple masks may be applied as part of the 193i process. Additionally, the 193i process may be associated with a 193i margin, such as a minimum distance (D1) that a via structure formed using the 193i process is to be from another feature, such as one of the active area 148-150. The 193i margin (e.g., the minimum distance (D1)) may include or correspond to a threshold lateral distance as described above with reference to the semiconductor device 100. Accordingly, the 193i margin may result in (e.g., dictate) an overall distance between a first active area 148 and a second active area 150.

Referring to the right illustration of the comparison 140, the 193i process (and/or another optical lithography process, such as the EUV process) is used in combination with the e-beam process to form a second version of the particular semiconductor device. The second version includes lines 172-176, active areas 178-180 (e.g., metal lines), and contacts 182-184, such as a source contact 182 and a drain contact 184. The lines 172-176, the active areas 178-180, and the contacts 182-184 of the second version (e.g., the right illustration) may correspond to the lines 142-146, the active areas 148-150, and the contacts 152-154 of the first version (e.g., the left illustration), respectively.

The second version may also include via structures 186-190, such as a first via structure 186, a second via structure 188, and a third via structure 190. The first via structure 186, the second via structure 188, and the third via structure 190 of the second version (e.g., the right illustration) may correspond to the first via structure 156, the second via structure 158, and the third via structure 160 of the first version (e.g., the left illustration), respectively. The 193i process may be used to form a cut pattern corresponding to the second via structure 188. The second via structure 188 may be positioned a first distance from a first active area 178 and a second distance from a second active area 180. Each of the first distance and the second distance may be greater than or equal to the 193i margin (e.g., the minimum distance (D1)). The e-beam process may be used to form cut patterns corresponding to the first via structure 186 and the third via structure 190. The e-beam process may be associated with an e-beam margin, such as a minimum distance (D2) that a via structure formed using the e-beam process is to be from another feature, such as one of the active area 148-150. The minimum distance (D2) associated with the e-beam process may be smaller than the minimum distance (D1) associated with the 193i process. Thus, use of the e-beam process to form one or more vias may result in an overall distance between the active areas 178-180 of the second version (e.g., the right illustration) that is smaller than the overall distance between the active areas 148-150 of the first version (e.g., the left illustration). For example, a distance (D3) may correspond to a difference between a distance between the active areas 148, 150 of the first version (e.g., the left illustration) and a distance between the active areas 178, 180 of the second version (e.g., the right illustration).

Referring to the semiconductor device 100, during operation, one or more electrical signals (e.g., voltage signals and/or current signals) may be supplied to the semiconductor device 100. For example, a first voltage value may be applied to the second contact 116 and a second voltage value may be applied to the first contact 118. The different features (e.g., the lines 102-110, the active areas 112-114, the contacts 116-118, and/or the plurality of vias) may enable the electrical signals of the semiconductor device 100 to propagate between different components coupled to the features of the semiconductor device 100.

In some implementations, one or more of the via structures included in the first of via structures 120 may be included in the second set of via structures and may be formed using the e-beam process. For example, if two via structures are separated by a distance that is less than or equal to the threshold distance, one or both of the two via structures may be formed using the e-beam process. To illustrate, if the first via structure 122 and the second via structure 124 are separated by a particular lateral distance that is less than or equal to the threshold lateral distance, the first via structure 122 and/or the second via structure 124 may be included in the second set of via structures 130 and formed using the e-beam process. Additionally or alternatively, one or more via structures of the first set of via structures 120 may be included in the second set of via structures 130 based on a number of via structures to be formed using a particular mask. For example, when the number of via structures to be formed using the particular mask is less than or equal to a threshold number, each via structure to be formed using the particular mask may be included in the second set of via structures and may be formed using the e-beam process. To illustrate, when the threshold number is equal to one, a first number of via structures to be formed using the second mask is equal to the threshold number. Accordingly, the second via structure 124 may be included in the second set of via structures 130 and may be formed using the e-beam process. By comparing a number of via structures of a particular mask to the threshold number and using the e-beam process when the number of via structures is less than or equal to the threshold number, a number of masks used to form the first set of via structures 120 may be reduced.

Although the first set of via structures 120 has been described as being formed using the 193i process and the second set of via structures 130 has been described as being formed using the e-beam process, in other implementations different processes may be used to form the first set of via structures 120 and the second set of via structures. For example, a first process may be used to form the first set of via structures 120 and a second process may be used to form the second set of via structures 130. The first process may have a lower resolution than the second process. To illustrate, the first process may be the 193i process and the second process may be the EUV process.

By using a combination of the e-beam process and the first lithography processes to form the plurality of via structures (e.g., the first set of via structures 120 and the second set of via structures 130) of the semiconductor device 100, a fewer number of masks may be used as compared to forming the plurality of via structures using the first lithography process (e.g., without using the e-beam process). Additionally, forming the semiconductor device 100 using the combination of the e-beam process and the first lithography process may result in the semiconductor device 100 having a reduced footprint (e.g., reduced overall dimensions) as compared to forming the semiconductor device 100 without using the e-beam process.

Figure 2:
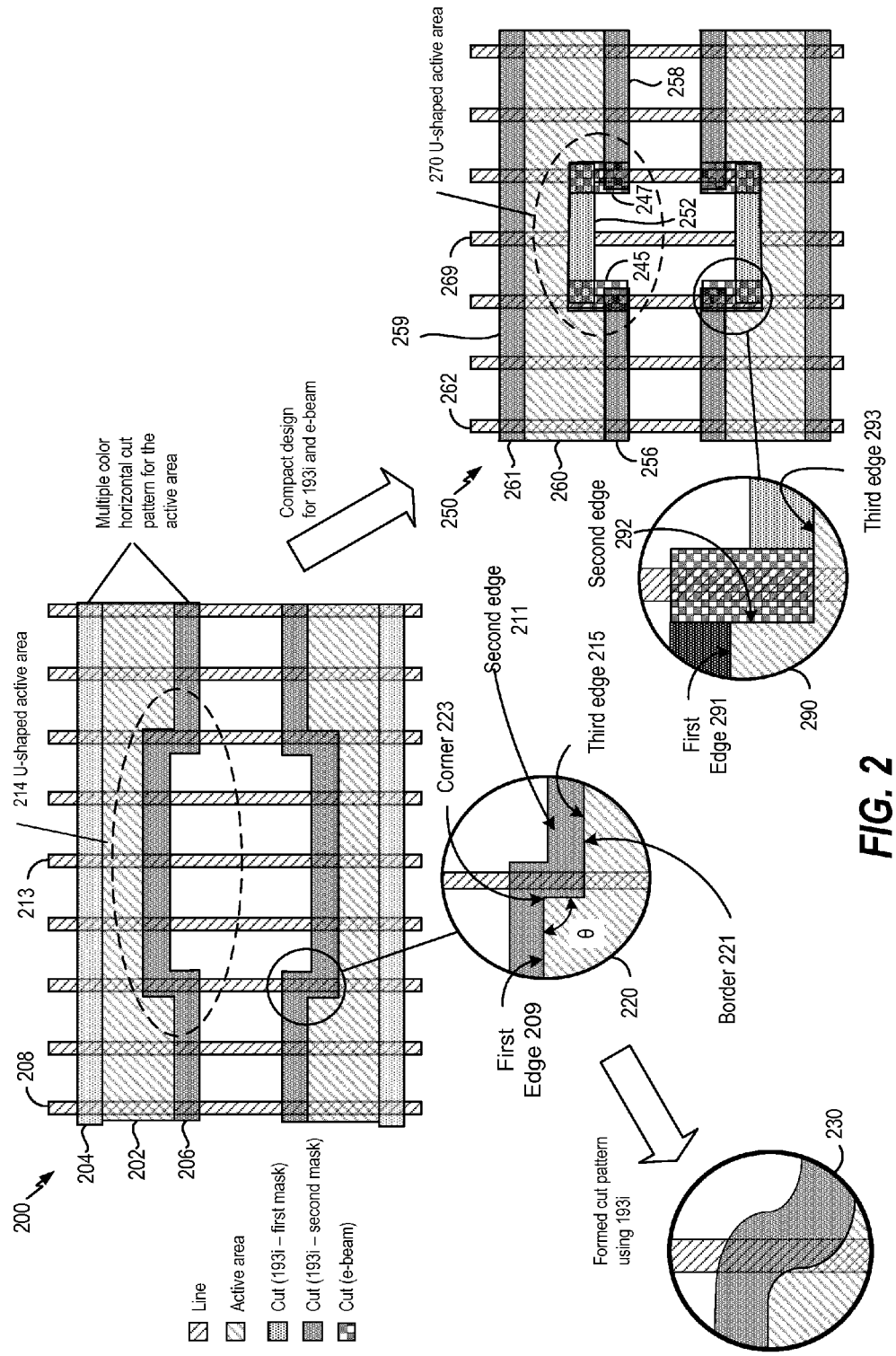

Referring to FIG. 2, diagrams of semiconductor devices having a U-shaped active area are depicted. A first semiconductor device is depicted and generally designated 200. The first semiconductor 200 may include or correspond to the semiconductor device 100 of FIG. 1.

The first semiconductor device 200 includes lines, such as a representative line 208 and active areas, such as a representative active area 202. For example, the lines of the first semiconductor device 200 may include or correspond to the lines 102-110 of FIG. 1. The active areas of the first semiconductor device 200 may include or correspond to the active areas 112-114 of FIG. 1.

The first semiconductor device 200 illustrates a layout design to form the active area 202 having a U-shaped portion 214. For example, the first semiconductor device 200 illustrates a multiple color horizontal cut pattern for the active area 202. The multiple color horizontal cut pattern may include a first cut pattern 204 and a second cut pattern 206. The multiple color horizontal cut pattern may be used during a first lithography process, such as an optical lithography process (e.g., the 193i process) to form the active area 202 having the U-shaped portion 214.

An exploded view of a portion of the first semiconductor devices 200 is depicted at 200. The exploded view 220 shows part of a U-shaped portion of a particular active area of the first semiconductor device 200. The particular active area includes a border 221 having a first edge 209, a second edge 211, and a third edge 213. The first edge 209 and the second edge 211 may intersect at a corner 223. The corner 223 may be designed to have an angle θ, such as the angle between the first edge 209 and the second edge 211.

It is noted that the first semiconductor device 200 and the exploded view 220 each illustrate the layout design of the active area 202 and the multiple color horizontal cut pattern to be used during a first lithography process. When the cut patterns 204, 206 are formed using the 193i process, corners of a particular active area formed by the 193i process may be rounded as a result of a resolution of the 193i process, as illustrated at 230. To account for effects of corner rounding on operation of the first semiconductor device 200, the U-shaped portion 214 is designed to be centered on an active line 213 and the corners of the U-shaped portion 214 are designed to be positioned over lines of the first semiconductor device 200 that are more than one line away from the active line 213.

To compact the layout design of the first semiconductor device 200 and to reduce and/or eliminate the effects of corner rounding, cut patterns configured to form active areas may be made using a combination of the 193i process and the e-beam process. To compact the layout design of the first semiconductor device 200, an angle of a border of a particular active area may be identified, such as the angle θ of the border 221. The angle θ may be compared to a threshold angle, such as thirty degrees, as an illustrative, non-limiting example. When the angle θ is greater than or equal to the threshold angle, a single cut pattern configured to form the angle θ may be decomposed into multiple cut patterns (e.g., multiple features), such as a first cut pattern and a second cut pattern, as described herein. The first cut pattern and/or the second cut pattern may be formed using the e-beam process. For example, the first cut pattern may be formed using the 193i process and the second cut pattern may be formed using a higher resolution process than the 193i process, such as the EUV process or the e-beam process.

A second semiconductor device having active areas formed using the 193i process and the e-beam process is depicted and generally designated 250. The second semiconductor device 250 includes lines, such as a representative line 262 and active areas, such as a representative active area 260. For example, the lines of the second semiconductor device 250 may include or correspond to the lines 102-110 of FIG. 1. The active areas of the second semiconductor device 250 may include or correspond to the active areas 112-114 of FIG. 1.

The active area 260 includes a U-shaped portion 270 that is formed by multiple cut patterns. In some implementations, the U-shaped portion 270 may be centered on an active line 269. A first set of cut patterns (e.g., one or more cut patterns) of the multiple cut patterns may be made using the 193i process and a first mask. To illustrate, the first set of cut patterns may include a first cut pattern 252, as an illustrative, non-limiting example. A second set of cut patterns of the multiple cut patterns may be made using the 193i process and a second mask. The second set of cut patterns may include a second cut pattern 256, a third cut pattern 258, and a fourth cut pattern 259, as illustrative, non-limiting examples. A third set of cut patterns of the multiple cut patterns may be made using the e-beam process. For example, the third set of cut patterns may include a fifth cut pattern 245 and a sixth cut pattern 247, as illustrative, non-limiting examples.

An exploded view of the second semiconductor device 250 is depicted at 290. The exploded view 290 shows part of a U-shaped portion of a particular active area of the second semiconductor device 250. The particular active area includes a border that includes a first edge 291, a second edge 292, and a third edge 293. The first edge 291 and the second edge 292 may intersect at a corner that is substantially perpendicular (e.g., an intersection of the first edge 291 and the second edge 292 is substantially perpendicular). Because the corners of the U-shaped portion 270 do not suffer from corner rounding resulting from a single 193i cut pattern, the corners of the U-shaped portion 270 may be positioned over lines of the second semiconductor device 250 that are one line away from the active line 269, thus making the U-shaped portion 270 of the second semiconductor device 250 more compact as compared to the U-shaped portion 214 of the first semiconductor device 200. To illustrate, the U-shaped portion 214 may span five lines of the first semiconductor device 200 while the U-shaped portion 270 spans three lines of the second semiconductor device 250.

By decomposing the 193i cut patterns into multiple cut patterns and forming one or more of the cut patterns using the e-beam process, a layout design of the first semiconductor device 200 may be compacted. Additionally, by using the e-beam process to form one or more cut patterns, corner rounding, such as corner rounding associated with active areas, may be reduced and/or eliminated.

Figure 3:
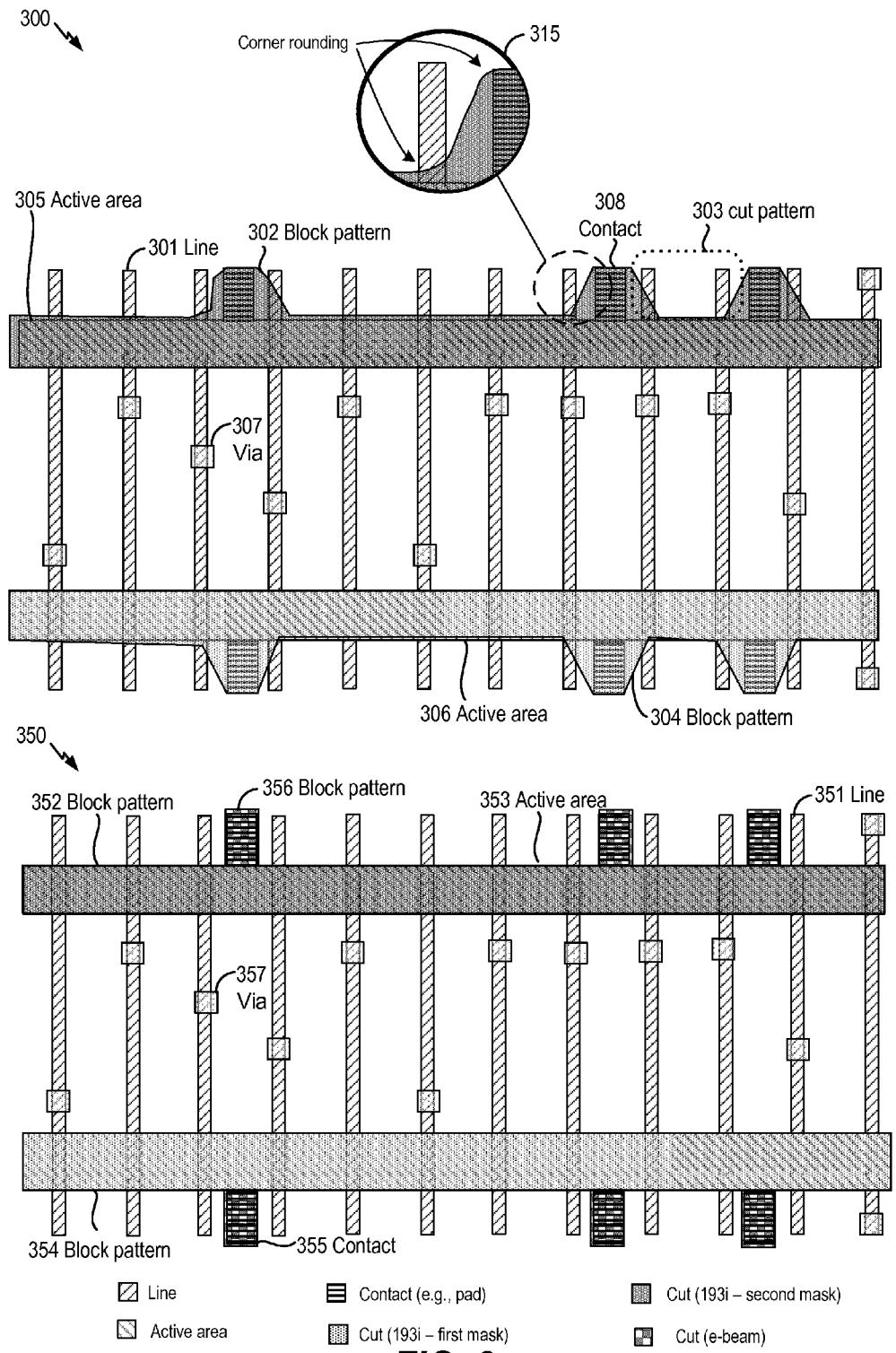

Referring to FIG. 3, diagrams of semiconductor devices having active areas coupled to contacts are depicted. A first semiconductor device is depicted and generally designated 300. The first semiconductor device 300 may include or correspond to the semiconductor device 100 of FIG. 1, the first semiconductor device 200, or the second semiconductor device 250 of FIG. 2.

A first semiconductor device 300 includes first lines, such as a representative first line 301, and first via structures, such as a representative first via structure 307. For example, the first lines of the first semiconductor device 300 may include or correspond to the lines 102-110 of FIG. 1, the lines of the first semiconductor device 200, or the lines of the second semiconductor device 250 of FIG. 2. The first via structures may include or correspond to the plurality of via structures (e.g., the first set of via structures 120 and/or the second set of via structures 130) of the semiconductor device 100 of FIG. 1. The first semiconductor device 300 further includes one or more active areas, such as a first active area 305 and a second active area 306. The active areas 305-306 may include or correspond to the active areas 112-114 of FIG. 1, the active areas of the first semiconductor device 200, or the active areas of the second semiconductor device 250 of FIG. 2. The first semiconductor device 300 also includes one or more contacts, such as a first representative contact 308. The contacts of the first semiconductor device 300 may include or correspond to the contacts 116-118 of FIG. 1. The first active area 305 may be coupled to a first set of contacts including the first contact 308. The second active area 306 may be coupled to a second set of contacts that is distinct form the first set of contacts.

The first active area 305 and the first set of contacts may correspond to a first block pattern 302 formed using the 193i process. For example, the first active area 305 and the first set of contacts may be formed using a first mask applied during the 193i process. The second active area 306 and the second set of contacts may correspond to a second block pattern 304. For example, the second active area 306 and the second set of contacts may be formed using a second mask applied during the 193i process. Based on a resolution of the 193i process, forming a particular active area and one or more corresponding contacts using a single 193i block pattern may result in corner rounding. For example, referring to an exploded view 315 of a portion of the first semiconductor device 300, examples of corner rounding are depicted.

After a particular block pattern is formed, such as the first block pattern 302, one or more cut patterns may be applied to further define (e.g., establish) features associated with the block pattern. For example, after the first block pattern 302 is formed, a cut pattern 303 may be applied using the 193i process. The cut pattern 303 may be applied to cut out portions of the first block pattern 302 in order to better define portions of one or more contacts, such as the first contact 308.

To reduce and/or eliminate rounding caused by a single 193i block pattern used to form a particular active area and one or more contacts, the single 193i block pattern may be decomposed into multiple block patterns. For example, each of the first block pattern 302 and the second block pattern 304 may be decomposed into multiple block patterns as described with reference to a second semiconductor device designated 350. The second semiconductor device 350 may include or correspond to the semiconductor device 100 of FIG. 1, the first semiconductor device 200, or the second semiconductor device 250 of FIG. 2.

The second semiconductor device 350 includes second lines, such as a representative second line 351, and second via structures, such as a representative first via structure 357. For example, the second lines of the second semiconductor device 350 may include or correspond to the lines 102-110 of FIG. 1, the lines of the first semiconductor device 200, or the lines of the second semiconductor device 250 of FIG. 2. The second via structures may include or correspond to the plurality of via structures (e.g., the first set of via structures 120 and/or the second set of via structures 130) of the semiconductor device 100 of FIG. 1. The second semiconductor device 350 further includes one or more active areas, such as a representative active area 353. The active areas of the second semiconductor device 350 may include or correspond to the active areas 112-114 of FIG. 1, the active areas of the first semiconductor device 200, or the active areas of the second semiconductor device 250 of FIG. 2. The second semiconductor device 350 also includes one or more contacts, such as a representative second contact 355. The contacts of the second semiconductor device 350 may include or correspond to the contacts 116-118 of FIG. 1. The active area 353 may be coupled to a first set of contacts. The active area 353 may be formed using a first block pattern 352 associated with the 193i process. Each contact of the first set of contacts coupled to the active area 353 may be formed by a corresponding block pattern associated with the e-beam pattern. For example, the e-beam process may be used to form an e-beam block pattern 356 that corresponds to a particular contact of the first set of contacts. By using a combination of the 193i process and the e-beam process to form a particular active area and to form one or more contacts coupled to the particular active area, corner rounding, such as corner rounding associated with using a single 193i block pattern to form an active area and one or more contacts, may be reduced and/or eliminated.

Figure 4:
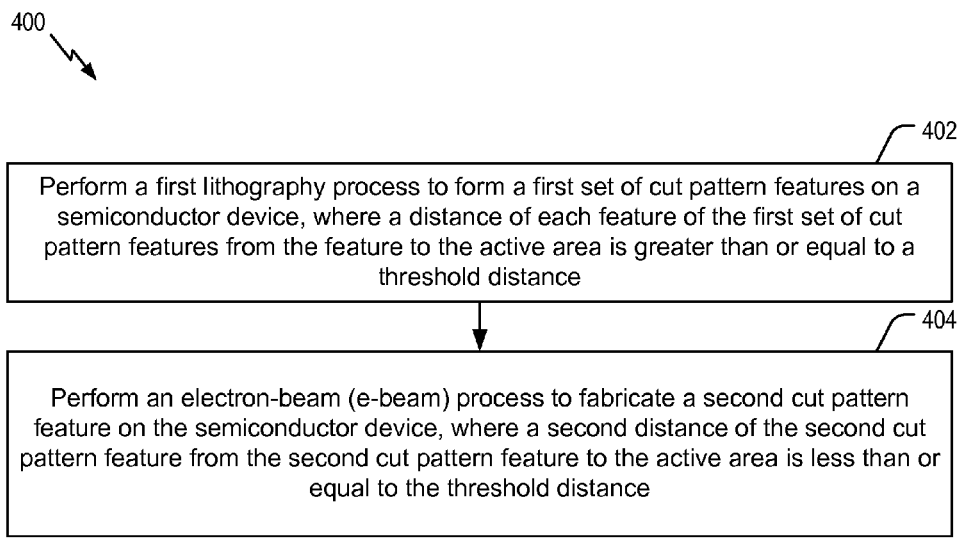
FIG. 4 is a flow chart of a particular illustrative embodiment of a method of forming a semiconductor device that includes e-beam based semiconductor device features.

Referring to FIG. 4, a flow diagram of an illustrative embodiment of a method 400 of forming a semiconductor device is depicted and generally designated 400. The semiconductor device may include or correspond to the semiconductor device 100 of FIG. 1, the first semiconductor device 200, the second semiconductor device 250 of FIG. 2, the first semiconductor device 300, the second semiconductor device 350 of FIG. 3, or a combination thereof.

The method 400 may further include performing a first lithography process to fabricate a first set of cut pattern features on the semiconductor device, at 402. A distance of each feature of the first set of cut pattern features from the feature to the active area is greater than or equal to a threshold distance. The distance may be a lateral (e.g., horizontal) distance, a height (e.g., vertical) distance, and/or a diagonal (e.g., direct) distance. The threshold distance may be a threshold lateral distance, a threshold height distance, and/or a threshold diagonal distance. The first set of cut pattern features may include or correspond to the first set of cut pattern features 120 of FIG. 1, such as a first set of via structures. For example, the active area may include or correspond to one of the active areas 112-114, 148-150, 178-180 of FIG. 1, one of the active areas 202, 260 of FIG. 2, or one of the active areas of the first semiconductor device 300 or the second semiconductor device 350 of FIG. 3. The first lithography process may include a 193 nanometer (nm) immersion (193i) process or an extreme ultraviolet (EUV) process. The threshold distance may include or correspond to a spacing margin of the first lithography process. In some implementations, the first set of cut pattern features is formed using a single mask. In other implementations, the first set of cut pattern features is formed using multiple masks.

The method 400 may also include performing an electron-beam (e-beam) process to fabricate a second cut pattern feature on the semiconductor device, at 404. A second distance of the second cut patter feature from the second cut pattern feature to the active area is less than or equal to the threshold distance. For example, the second cut pattern feature may be included in a second set of cut pattern features (e.g., a set of one or more cut pattern features), such as the second set of cut pattern features 130 of FIG. 1. When the second cut pattern feature is included in the second set of cut pattern features, a second distance of each feature of the second set of cut pattern features from the feature to the active area is less than or equal to the threshold distance. For example, when the second distance is a lateral distance, a lateral distance of each feature of the second set of cut pattern features from the feature to the active area is less than or equal to a threshold lateral distance. As another example, when the second distance is a height distance, a height distance of each feature of the second set of cut pattern features from the feature to the active area is less than or equal to a threshold height distance. The e-beam process may be a higher resolution process than the first lithography process. The e-beam process may be configured to form the second set of cut pattern features using a single pass cut pattern process. In some implementations, the e-beam process to fabricate the second cut pattern feature may be initiated after the first lithography process to fabricate the first set of cut pattern features. In other implementations, the e-beam process to fabricate the second cut pattern feature may be initiated before the first lithography process is initiated to fabricate the first set of cut pattern features.

In some implementations, the active area may be formed by performing the first lithography process to form a first edge of the active area and performing the e-beam process to form a second edge of the active area. A corner may correspond to an intersection of the first edge and the second edge. For example, the first edge and the second edge may include or correspond to the first edge 209 and the second edge 211 of FIG. 2, respectively. Additionally or alternatively, the method 400 may include forming a contact that is coupled to the active area. The contact may include or correspond to the contacts 116-118 of FIG. 1, a contact of the first semiconductor device 300, or a contact of the second semiconductor device 350 of FIG. 3. In some implementations, when the active area is formed using the first lithography process, the contact may be formed using the e-beam process.

In other implementations, the 193i process may be performed to create a horizontal cut pattern associated with the active area and the e-beam process may be performed to create a first cut pattern and a second cut pattern. The horizontal cut pattern may include or correspond to the horizontal cut pattern 252 of FIG. 3. The first cut pattern and the second cut pattern may include or correspond to the fifth cut pattern 245 and the sixth cut pattern 247 of FIG. 2, respectively. Each of the first cut pattern and the second cut pattern may be substantially perpendicular to the horizontal cut pattern, such that the horizontal cut pattern, the first cut pattern, and the second cut pattern define a U-shaped active area. For example, the U-shaped active area may include or correspond to the U-shaped active area 270 of FIG. 2.

In some implementations, prior to fabrication of the first set of cut pattern features and/or prior to fabrication of one or more second cut pattern features (e.g., the second cut pattern feature) the 193i process may be performed to form a one dimensional (1D) line and space pattern. For example, the 1D line and space pattern may be formed prior to forming the active area. Additionally or alternatively, a second lithography process may be performed to fabricate a first block cut pattern on the semiconductor device and the e-beam process may be performed to fabricate a second block cut pattern on the semiconductor device. For example, the first block cut pattern may include or correspond to one of the block patterns 302, 304, 352, 354 of FIG. 3. The second block cut pattern may include or correspond to the block cut pattern 356 of FIG. 3. In some implementations, the first block cut pattern and the second block cut pattern may be formed subsequent to fabrication of the first set of cut pattern features and/or prior to fabrication of one or more second cut pattern features (e.g., the second cut pattern feature). The second lithography process may be the 193i process and the e-beam process to form the second block cut pattern may use chemical amplification. In some implementations, the second block cut pattern may include or correspond to a contact, such as the second contact 116 or the first contact 118 of FIG. 1, as illustrative, non-limiting examples.

The method 400 may be used to form a semiconductor device that includes the first set of cut pattern features (formed according to the first lithography process) and the second cut pattern feature (formed according to the e-beam process). By using both the first lithography process and the e-beam process, a fewer number of masks may be used as compared to forming both the first set of cut pattern features and the second cut pattern feature using the first lithography process (e.g., without using the e-beam process). Additionally, using both the first lithography process (to form the first set of cut pattern features) and the e-beam process (to form the second cut pattern feature) may result in the semiconductor device having a reduced footprint (e.g., reduced overall dimensions) as compared to a semiconductor device having both the first set of cut pattern features and the second cut pattern feature formed using the first lithography process (e.g., without using the e-beam process). Accordingly, using the e-beam process and the first lithography processes may decrease a cost and an amount of time to produce the semiconductor device as compared to forming the semiconductor device without using the e-beam process.

Figure 5:
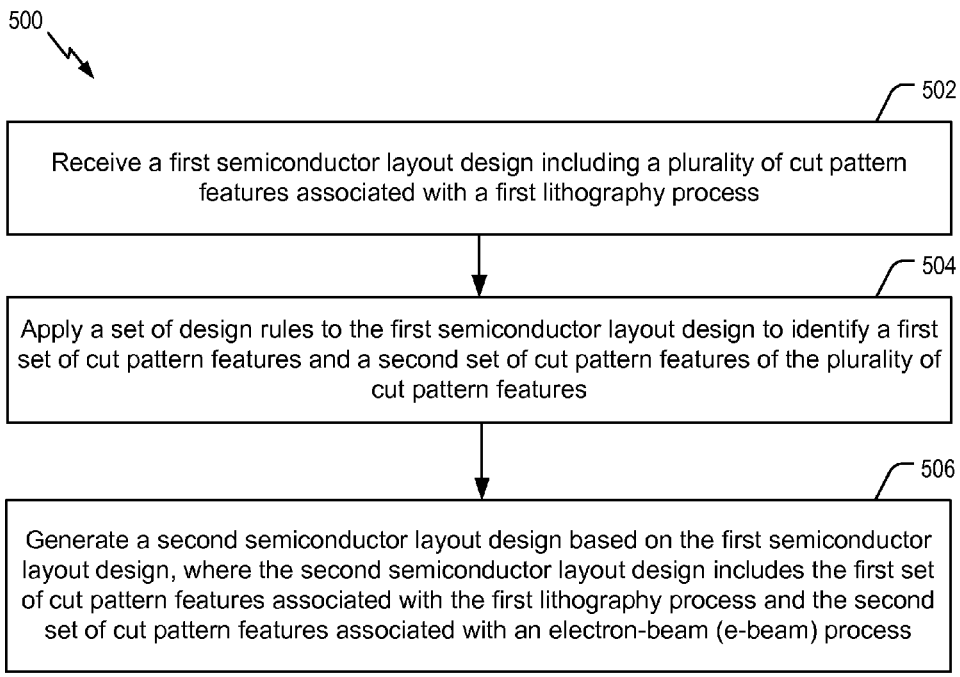
FIG. 5 is a flow chart of a particular illustrative embodiment of a method of generate a semiconductor layout design that includes e-beam based semiconductor device features.

Referring to FIG. 5, a flow diagram of an illustrative embodiment of a method of generating a semiconductor layout design that includes e-beam based semiconductor device features is depicted and generally designated 500. The semiconductor layout design may be used to fabricate the semiconductor device 100 of FIG. 1, the first semiconductor device 200, the second semiconductor device 250 of FIG. 2, the first semiconductor device 300, the second semiconductor device 350 of FIG. 3, or a combination thereof.

The method 500 may include receiving a first semiconductor layout design including a plurality of cut pattern features associated with a first lithography process, at 502. The first lithography process may be a 193 nanometer (nm) immersion (193i) process. In some implementations, the plurality of cut pattern features may include a plurality of via cut patterns, such as a plurality of via cut pattern features corresponding to the first set of cut pattern features 120 and the second set of cut pattern features 130 of FIG. 1. In some implementations, the first semiconductor layout design may include an active area, such as one of the active areas 112-114 of FIG. 1, one of the active areas 202, 260 of FIG. 2, or one of the active areas of the first semiconductor device 300 or the second semiconductor device 350 of FIG. 3.

The method 500 may further include applying a set of design rules to the first semiconductor layout design to identify a first set of cut pattern features and a second set of cut pattern features of the plurality of cut pattern features, at 504. For example, the first set of cut pattern features and the second set of cut pattern features may include or correspond to the first set of cut pattern features 120 and the second set of cut pattern features 130 of FIG. 1, respectively. Each of the first set of cut pattern features and the second set of cut pattern features may include one or more cut pattern features. In some implementations, applying the set of design rules includes identifying a spacing (e.g., a horizontal spacing, a vertical spacing, and/or a diagonal spacing) of a particular cut pattern feature of the plurality of cut pattern features that is greater than or equal to a threshold distance. For example, a horizontal spacing (e.g., a lateral spacing) may be a distance from particular cut pattern feature to an active area of the semiconductor device. Each of the one or more cut pattern features is included in the second set of cut pattern features.

The method 500 may further include generating a second semiconductor layout design based on the first semiconductor layout design, at 506. The second semiconductor layout design includes the first set of cut pattern features associated with the first lithography process and the second set of cut pattern features associated with an electron-beam (e-beam) process. For example, the second layout design may include or correspond to a layout design of the semiconductor device 100 of FIG. 1. In some implementations, the first semiconductor layout design and the second semiconductor layout design may include or correspond to the first version of the particular semiconductor (e.g., the left illustration) and the second version of the particular semiconductor (e.g., the right illustration) depicted at 140 of FIG. 1, respectively.

In some implementations, applying the set of design rules includes identifying a distance between a first cut pattern via and a second cut pattern via. For example, the first cut pattern via and the second cut pattern via may include or correspond to the first via structure 122 and the second via structure 124 of FIG. 1, respectively. To illustrate, the first cut pattern via may be associated with a first mask (e.g., a first color mask) and the second cut pattern via may be associated with a second mask (e.g., a second color mask). The distance may be compared to a threshold distance and, in response to a determination that the distance is less than or equal to the threshold distance, the first cut pattern via and/or the second cut pattern via may be included in the second set of cut pattern features.

Additionally or alternatively, applying the set of design rules may include identifying an angle associated with a border of a particular cut pattern feature of the plurality of cut pattern features. For example, the particular cut pattern feature may include or correspond to an active area, such as one of the active areas 112-114 of FIG. 1, one of the active areas 202, 260 of FIG. 2, or one of the active areas of the first semiconductor device 300 or the second semiconductor device 350 of FIG. 3. The angle may include or correspond to the angle θ, as depicted in FIG. 2. The angle may be compared to a threshold angle and, in response to a determination that the angle is greater than or equal to the threshold angle, the particular cut pattern feature may be decomposed into multiple features and/or multiple cut patterns. A first feature of the multiple features (and/or a first cut pattern of the multiple cut patterns) may be associated with the first set of cut pattern features and a second feature of the multiple features (and/or a second cut pattern of the multiple cut patterns) may be associated with the second set of cut pattern features. To illustrate, in response to a determination that the angle is greater than the threshold angle, the first set of cut patterns may be associated with the first lithography process (e.g., an optical lithography process) and the second set of cut patterns may be associated with a process that has a higher resolution than the first lithography process.

In some implementations, applying the set of design rules may include identifying two via structures that are separated by a distance that is less than or equal to the threshold distance. When the distance is less than or equal to the threshold distance, one or both of the two via structures may be formed using the e-beam process. To illustrate, two via structures may be identified that are separated by a lateral distance that is less than or equal to a threshold lateral distance and one or both of the two via structures may be formed using the e-beam process. Additionally or alternatively, applying the set of design rules may include identifying a number of via structures to be formed using a particular mask (e.g., a particular 193i color mask). The number of via structures (e.g., a total number of via structures to be formed using the particular mask) may be compared to a threshold number. In response to a determination that the number of via structure is less than or equal to a threshold number, each via structure associated with the particular mask may be formed using the e-beam process.

In some implementations, the plurality of cut pattern features may include an active area and a contact. For example, the active area may include or correspond to one of the active areas 112-114 of FIG. 1, one of the active areas 202, 260 of FIG. 2, or one of the active areas of the first semiconductor device 300 or the second semiconductor device 350 of FIG. 3. The contact may include or correspond to one of the contacts 116-118, or a contact of the first semiconductor device 300 or the second semiconductor device 350 of FIG. 3. The active area may be coupled to (e.g., in physical contact with) the contact. Applying the set of design rules includes identifying the contact that is coupled to the active area and including the active area in the first set of cut pattern features and including the contact in the second set of cut pattern features. To illustrate, referring to the semiconductor device 350 of FIG. 3, an active area included in the first set of cut pattern features may correspond to a first block pattern 352 formed using the 193i process and a contact included in the second set of cut pattern features may correspond to the second cut pattern 356 formed using the e-beam process (or a higher resolution process than the 193i process).

The method 500 may be used to generate a semiconductor layout design that uses a combination of a first lithography process (e.g., the 193i process) and another process, such as the EUV process or the e-beam process, which has a higher resolution than the 193i process. For example, by applying the one or more design rules, one or more cut pattern features and one or more cut patterns may be identified to be formed using the other process (e.g., the EUV process or the e-beam process that is a higher resolution than the first lithography process). By generating the semiconductor layout design that uses the first lithography process and another process, a particular semiconductor device formed according to the semiconductor layout design may have a smaller footprint (e.g., reduced overall dimensions) as compared to a corresponding semiconductor device formed according to a particular semiconductor layout design that uses a single process (e.g., a single lithography process, such as the 193i process).

The process shown in the method 400 of FIG. 4 and/or the method 500 of FIG. 5 may be controlled by a processing unit such as a central processing unit (CPU), a controller, a field-programmable gate array (FPGA) device, an application-specific integrated circuit (ASIC), another hardware device, firmware device, or any combination thereof. As an example, the method 400 of FIG. 4 and/or the method 500 of FIG. 5 can be performed by one or more processors that execute instructions to control fabrication equipment.

Figure 6:
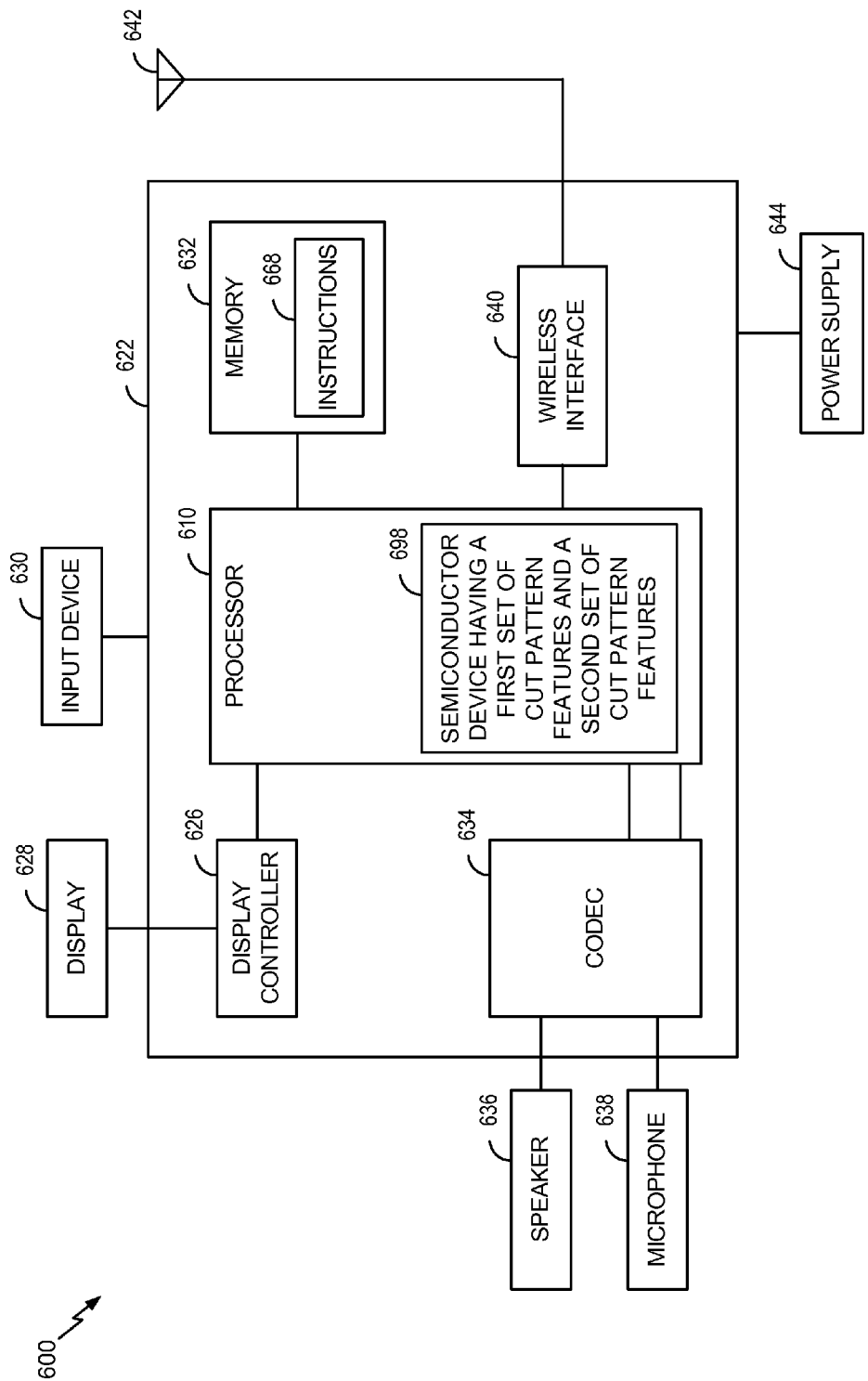
FIG. 6 is a block diagram of a device including e-beam based semiconductor device features.

Referring to FIG. 6, a block diagram of a particular illustrative embodiment of a device 600 (e.g., an electronic device), such as a wireless communication device, is depicted. The device 600 includes a processor 610, such as a digital signal processor (DSP), coupled to a memory 632. The processor 610, or components thereof, may include the semiconductor device 698. The semiconductor device 698 includes a first set of cut pattern features and a second set of cut pattern features. The first set of cut pattern features and the second set of cut pattern features may include or correspond to the first set of cut pattern features 120 and the second set of cut pattern features 130 of FIG. 1, respectively, as illustrative, non-limiting examples.

To illustrate, the processor 610 may be constructed in such a way that components of the processor 610 may be electrically connected using one or more structures, such as one or more lines, one or more contacts, one or more active areas, and/or one or more via structures. For example, the one or more lines may include or correspond to one or more of the lines 102-110, 142-146, 172-176 of FIG. 1, one or more of the lines 208, 234, 262 of FIG. 2, or one or more of the lines of the semiconductor device 300, 350 of FIG. 3. The one or more contacts may include or correspond to the contacts 116-118, 152-154, 182-184, or one or more contacts of the semiconductor device 300, 350 of FIG. 3. The one or more active areas may include or correspond to the active areas 112-114, 148-150, 178-180 of FIG. 1, one of the active areas 202, 260 of FIG. 2, or one of the active areas of the semiconductor device 300, 350 of FIG. 3. The one or more via structures may include or correspond to the first set of via structures 120, the second set of via structures 130, the vias 156-160, 186-190 of FIG. 1, or the via structures included in the semiconductor device 300, 350 of FIG. 3.

The memory 632 includes instructions 668 (e.g., executable instructions) such as computer-readable instructions or processor-readable instructions. The instructions 668 may include one or more instructions that are executable by a computer, such as the processor 610.

FIG. 6 also shows a display controller 626 that is coupled to the processor 610 and to a display 628. A coder/decoder (CODEC) 634 can also be coupled to the processor 610. A speaker 636 and a microphone 638 can be coupled to the CODEC 634.

FIG. 6 also indicates that a wireless interface 640 can be coupled to the processor 610 and to an antenna 642. In some implementations, the semiconductor device 100, the processor 610, the display controller 626, the memory 632, the CODEC 634, and the wireless interface 640 are included in a system-in-package or system-on-chip device 622. In a particular embodiment, an input device 630 and a power supply 644 are coupled to the system-on-chip device 622. Moreover, in a particular embodiment, as illustrated in FIG. 6, the display 628, the input device 630, the speaker 636, the microphone 638, the antenna 642, and the power supply 644 are external to the system-on-chip device 622. However, each of the display 628, the input device 630, the speaker 636, the microphone 638, the antenna 642, and the power supply 644 can be coupled to a component of the system-on-chip device 622, such as an interface or a controller. Although the semiconductor device 698 is depicted as being included in the processor 610, in other implementations, the semiconductor device 698 may be included in another component of the device 600 or a component coupled to the device 600. For example, the semiconductor device 698 may be included in the memory 632, as an illustrative, non-limiting example.

In conjunction with one or more of the described embodiments of FIGS. 1-6, an apparatus is disclosed that may include first means for conducting first electrical signals (e.g., voltage signals and/or current signals) in a semiconductor device, the first means for conducting formed by a first lithography process. A distance from the first means for conducting to an active area of the semiconductor device is greater than or equal to a threshold distance. The first means for conducting may include or correspond to the first set of cut pattern features 120, the via structures 156-160, 180 of FIG. 1, one or more via structures of the first semiconductor device 300 or the second semiconductor device 350 of FIG. 3, one or more other structures configured to conduct the first electrical signals, or any combination thereof.

The apparatus may also include second means for conducting second electrical signals (e.g., voltage signals and/or current signals) in the semiconductor device, the second means for conducting formed by an e-beam process. A second distance from the second means for conducting to the active area is less than or equal to the threshold distance. The second first means for conducting may include or correspond to the second set of cut pattern features 130, the via structures 186, 190 of FIG. 1, one or more via structures of the first semiconductor device 300 or the second semiconductor device 350 of FIG. 3, one or more other structures configured to conduct the first electrical signals, or any combination thereof.

One or more of the disclosed embodiments may be implemented in a system or an apparatus, such as the electronic device 600, that may include a communications device, a fixed location data unit, a mobile location data unit, a mobile phone, a cellular phone, a satellite phone, a computer, a tablet, a portable computer, a display device, a media player, or a desktop computer. Alternatively or additionally, the electronic device 600 may include a set top box, an entertainment unit, a navigation device, a personal digital assistant (PDA), a monitor, a computer monitor, a television, a tuner, a radio, a satellite radio, a music player, a digital music player, a portable music player, a video player, a digital video player, a digital video disc (DVD) player, a portable digital video player, a satellite, a vehicle, any other device that includes a processor or that stores or retrieves data or computer instructions, or a combination thereof. As another illustrative, non-limiting example, the system or the apparatus may include remote units, such as hand-held personal communication systems (PCS) units, portable data units such as global positioning system (GPS) enabled devices, meter reading equipment, or any other device that includes a processor or that stores or retrieves data or computer instructions, or any combination thereof.

Figure 7:
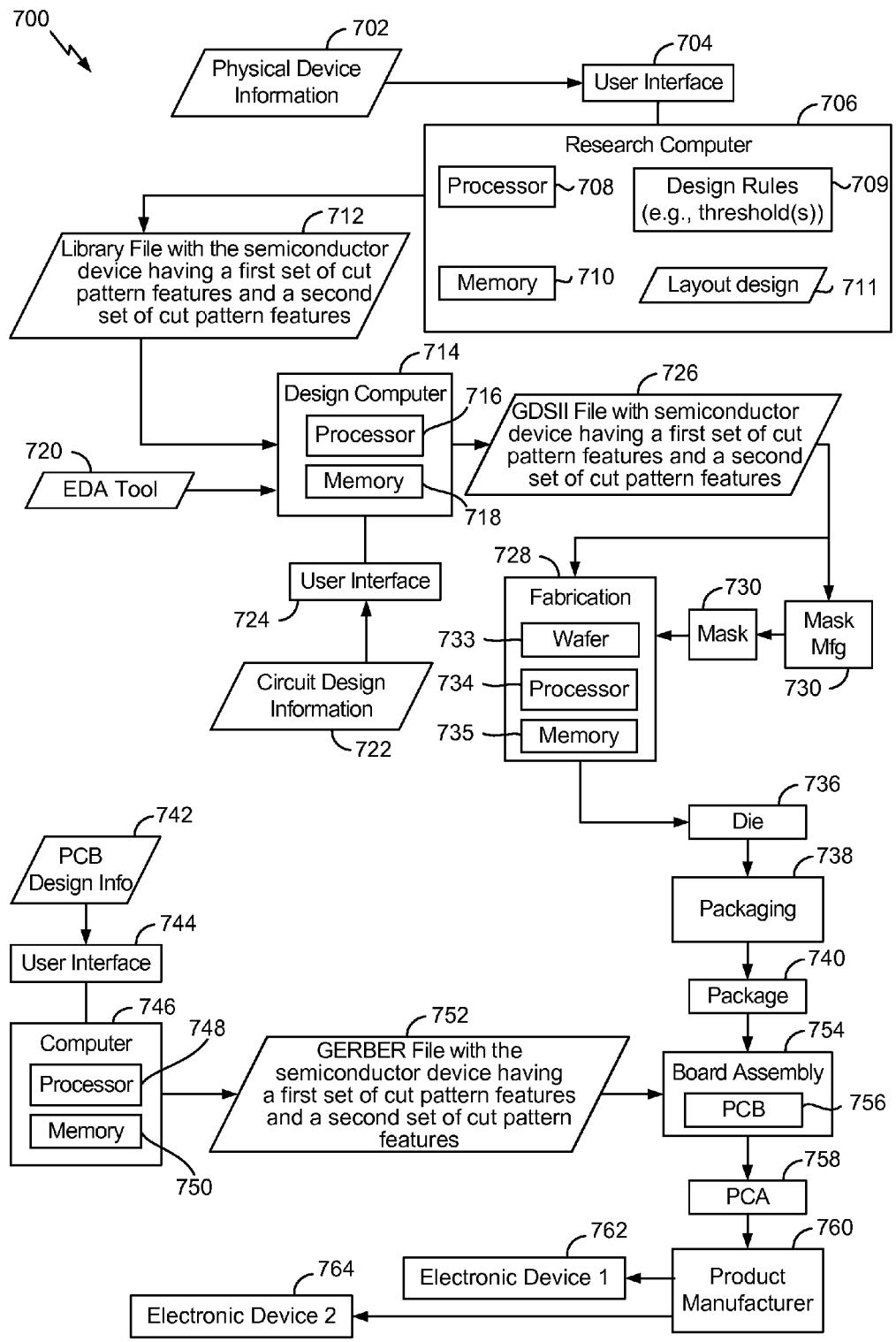
FIG. 7 is a data flow diagram of a particular illustrative embodiment of a manufacturing process to manufacture electronic devices that include e-beam based semiconductor device features.

The foregoing disclosed devices and functionalities may be designed and configured into computer files (e.g. RTL, GDSII, GERBER, etc.) stored on computer-readable media. Some or all such files may be provided to fabrication handlers who fabricate devices based on such files. Resulting products include semiconductor wafers that are then cut into semiconductor die and packaged into a semiconductor chip. The chips are then employed in devices described above. FIG. 7 depicts a particular illustrative embodiment of an electronic device manufacturing process 700.

Physical device information 702 is received at the manufacturing process 700, such as at a research computer 706. The physical device information 702 may include design information representing at least one physical property associated with the semiconductor device 100 of FIG. 1, the semiconductor device 250 of FIG. 2, the semiconductor device 350 of FIG. 3, the semiconductor device 698 of FIG. 6, or a combination thereof. For example, the physical device information 702 may include physical parameters, material characteristics, and structure information that is entered via a user interface 704 coupled to the research computer 706. The research computer 706 includes a processor 708, such as one or more processing cores, coupled to a computer-readable medium (e.g., a non-transitory computer-readable medium), such as a memory 710. The memory 710 may store computer-readable instructions that are executable to cause the processor 708 to transform the physical device information 702 to comply with a file format and to generate a library file 712.

The research computer 706 may also include design rules 709, such as one or more thresholds. The one or more thresholds may include a threshold distance as described with reference to FIG. 1, an angle threshold as described with reference to FIG. 2, or a combination thereof, as illustrative, non-limiting examples. Although the design rules 709 are illustrated as being distinct from the memory 710, in some embodiments, the design rules 709 may be stored in the memory 710. The processor 708 may be configured to apply the design rules 709 to the physical device information 702 to generate a layout design 711 (e.g., a semiconductor layout design). For example, the process 708 may be configured to generate the layout design 711 according to the method 500 of FIG. 5. Accordingly, the library file 712 may include or correspond to the layout design 711. To illustrate, the library file 712 may include a layout of a semiconductor device having a first set of cut pattern features and a second set of cut pattern features. Although the design rules 709 and the layout design 711 have been described with reference to the research computer 706, in other implementations, the design rules 709 and/or the layout design 711 may be included in or generated by another device, such as the design computer 714 as described herein.

In some implementations, the library file 712 includes at least one data file including the transformed design information. For example, the library file 712 may include a library of devices including a device that includes the semiconductor device 100 of FIG. 1, the semiconductor device 250 of FIG. 2, the semiconductor device 350 of FIG. 3, the semiconductor device 698 of FIG. 6, a semiconductor device formed according to the method 400 of FIG. 4, or a combination thereof, that is provided for use with an electronic design automation (EDA) tool 720.

The library file 712 may be used in conjunction with the EDA tool 720 at a design computer 714 including a processor 716, such as one or more processing cores, coupled to a memory 718. The EDA tool 720 may be stored as processor executable instructions at the memory 718 to enable a user of the design computer 714 to design a circuit including the semiconductor device 100 of FIG. 1, the semiconductor device 250 of FIG. 2, the semiconductor device 350 of FIG. 3, the semiconductor device 698 of FIG. 6, a semiconductor device formed according to the method 400 of FIG. 4, or a combination thereof. For example, a user of the design computer 714 may enter circuit design information 722 via a user interface 724 coupled to the design computer 714. The circuit design information 722 may include design information representing at least one physical property of a component (e.g., a transistor, an inverter, a memory cell, a logic gate, etc.) to be coupled to the semiconductor device 100 of FIG. 1, the semiconductor device 250 of FIG. 2, the semiconductor device 350 of FIG. 3, the semiconductor device 698 of FIG. 6, a semiconductor device formed according to the method 400 of FIG. 4, or a combination thereof. To illustrate, the circuit design property may include identification of particular circuits and relationships to other elements in a circuit design, positioning information, feature size information, interconnection information, or other information representing a physical property of components to be coupled to the semiconductor device 100 of FIG. 1, the semiconductor device 250 of FIG. 2, the semiconductor device 350 of FIG. 3, the semiconductor device 698 of FIG. 6, a semiconductor device formed according to the method 400 of FIG. 4, or a combination thereof. In other implementations, the circuit design property may be a design property of the semiconductor device 100 of FIG. 1, the semiconductor device 250 of FIG. 2, the semiconductor device 350 of FIG. 3, the semiconductor device 698 of FIG. 6, a semiconductor device formed according to the method 400 of FIG. 4, or a combination thereof, and a new design layout may be generated. For example, the design computer 714 may generate the new design layout according to one or more design rules, such as the design rules 709. The new design layout may correspond to the semiconductor device having the first set of cut pattern features and the second set of cut pattern features, such as of the semiconductor device 100 of FIG. 1, the semiconductor device 250 of FIG. 2, the semiconductor device 350 of FIG. 3, the semiconductor device 698 of FIG. 6, a semiconductor device formed according to the method 400 of FIG. 4, or a combination thereof.

The design computer 714 may be configured to transform the design information, including the circuit design information 722, to comply with a file format. To illustrate, the file format may include a database binary file format representing planar geometric shapes, text labels, and other information about a circuit layout in a hierarchical format, such as a Graphic Data System (GDSII) file format. The design computer 714 may be configured to generate a data file including the transformed design information, such as a GDSII file 726 that includes information describing the semiconductor device 100 of FIG. 1, the semiconductor device 250 of FIG. 2, the semiconductor device 350 of FIG. 3, the semiconductor device 698 of FIG. 6, a semiconductor device formed according to the method 400 of FIG. 4, or a combination thereof, in addition to other circuits or information. To illustrate, the data file may include information corresponding to a system-on-chip (SOC) that includes the semiconductor device 100 of FIG. 1, the semiconductor device 250 of FIG. 2, the semiconductor device 350 of FIG. 3, the semiconductor device 698 of FIG. 6, a semiconductor device formed according to the method 400 of FIG. 4, or a combination thereof, and that also includes additional electronic circuits and components within the SOC.

The GDSII file 726 may be received at a fabrication process 728 to manufacture the semiconductor device 100 of FIG. 1, the semiconductor device 250 of FIG. 2, the semiconductor device 350 of FIG. 3, the semiconductor device 698 of FIG. 6, a semiconductor device formed according to the method 400 of FIG. 4, or a combination thereof, according to transformed information in the GDSII file 726. For example, a device manufacture process may include providing the GDSII file 726 to a mask manufacturer 730 to create one or more masks, such as masks to be used with photolithography processing, illustrated as a representative mask 732. The mask 732 may be used during the fabrication process to generate one or more wafers 733, which may be tested and separated into dies, such as a representative die 736. The die 736 includes a circuit including a device that includes the semiconductor device 100 of FIG. 1, the semiconductor device 250 of FIG. 2, the semiconductor device 350 of FIG. 3, the semiconductor device 698 of FIG. 6, a semiconductor device formed according to the method 400 of FIG. 4, or a combination thereof.

For example, the fabrication process 728 may include a processor 734 and a memory 735 to initiate and/or control the fabrication process 728. The memory 735 may include executable instructions such as computer-readable instructions or processor-readable instructions. The executable instructions may include one or more instructions that are executable by a computer such as the processor 734.

The fabrication process 728 may be implemented by a fabrication system that is fully automated or partially automated. For example, the fabrication process 728 may be automated according to a schedule. The fabrication system may include fabrication equipment (e.g., processing tools) to perform one or more operations to form a semiconductor device, such as the semiconductor device 100 of FIG. 1, the semiconductor device 250 of FIG. 2, the semiconductor device 350 of FIG. 3, the semiconductor device 698 of FIG. 6, a semiconductor device formed according to the method 400 of FIG. 4, or a combination thereof. For example, the fabrication equipment may be configured to perform a 193 nanometer (nm) immersion (193i) process, an extreme ultraviolet (EUV) process, an electron-beam (e-beam) process, or a combination thereof, as illustrative, non-limiting examples.

The fabrication system (e.g., an automated system that performs the fabrication process 728) may have a distributed architecture (e.g., a hierarchy). For example, the fabrication system may include one or more processors, such as the processor 734, one or more memories, such as the memory 735, and/or controllers that are distributed according to the distributed architecture. The distributed architecture may include a high-level processor that controls or initiates operations of one or more low-level systems. For example, a high-level portion of the fabrication process 728 may include one or more processors, such as the processor 734, and the low-level systems may each include or may be controlled by one or more corresponding controllers. A particular controller of a particular low-level system may receive one or more instructions (e.g., commands) from a particular high-level system, may issue sub-commands to subordinate modules or process tools, and may communicate status data back to the particular high-level. Each of the one or more low-level systems may be associated with one or more corresponding pieces of fabrication equipment (e.g., processing tools). In some implementations, the fabrication system may include multiple processors that are distributed in the fabrication system. For example, a controller of a low-level system component may include a processor, such as the processor 734.

Alternatively, the processor 734 may be a part of a high-level system, subsystem, or component of the fabrication system. In another implementation, the processor 734 includes distributed processing at various levels and components of a fabrication system.

Thus, the processor 734 may include processor-executable instructions that, when executed by the processor 734, cause the processor 734 to initiate or control formation of the semiconductor device 100 of FIG. 1, the semiconductor device 250 of FIG. 2, the semiconductor device 350 of FIG. 3, the semiconductor device 698 of FIG. 6, a semiconductor device formed according to the method 400 of FIG. 4, or a combination thereof. In some implementations, the memory 735 is a non-transient computer-readable medium storing computer-executable instructions that are executable by the processor 734 to cause the processor 734 to initiate formation of a semiconductor device in accordance with at least a portion of the method 400 of FIG. 4. For example, the computer executable instructions may be executable to cause the processor 734 to initiate or control formation of the semiconductor device 100 of FIG. 1.

As an illustrative example, the processor 734 may initiate or control formation of an active area of a semiconductor device and may initiate or control a first lithography process to fabricate a first set of cut pattern features on the semiconductor device. Each feature of the first set of cut pattern features is associated with a corresponding first distance from the feature to the active area that is greater than or equal to a threshold distance. The processor may further initiate or control an electron-beam (e-beam) process to fabricate a second set of cut pattern features on the semiconductor device. Each feature of the second set of cut pattern features is associated with a corresponding second distance from the feature to the active area. The corresponding second distance is less than or equal to the threshold distance.

The die 736 may be provided to a packaging process 738 where the die 736 is incorporated into a representative package 740. For example, the package 740 may include the single die 736 or multiple dies, such as a system-in-package (SiP) arrangement. For example, the package 740 may include or correspond to the system in package or system-on-chip device 622 of FIG. 6. The package 740 may be configured to conform to one or more standards or specifications, such as Joint Electron Device Engineering Council (JEDEC) standards.

Information regarding the package 740 may be distributed to various product designers, such as via a component library stored at a computer 746. The computer 746 may include a processor 748, such as one or more processing cores, coupled to a memory 750. A printed circuit board (PCB) tool may be stored as processor executable instructions at the memory 750 to process PCB design information 742 received from a user of the computer 746 via a user interface 744. The PCB design information 742 may include physical positioning information of a packaged semiconductor device on a circuit board, the packaged semiconductor device including the semiconductor device 100 of FIG. 1, the semiconductor device 250 of FIG. 2, the semiconductor device 350 of FIG. 3, the semiconductor device 698 of FIG. 6, a semiconductor device formed according to the method 400 of FIG. 4, or a combination thereof.

The computer 746 may be configured to transform the PCB design information 742 to generate a data file, such as a GERBER file 752 with data that includes physical positioning information of a packaged semiconductor device on a circuit board, as well as layout of electrical connections such as traces (e.g., metal lines) and vias (e.g., via structures), where the packaged semiconductor device corresponds to the package 740 including the semiconductor device 100 of FIG. 1, the semiconductor device 250 of FIG. 2, the semiconductor device 350 of FIG. 3, the semiconductor device 698 of FIG. 6, a semiconductor device formed according to the method 400 of FIG. 4, or a combination thereof. In other implementations, the data file generated by the transformed PCB design information may have a format other than a GERBER format.

The GERBER file 752 may be received at a board assembly process 754 and used to create PCBs, such as a representative PCB 756, manufactured in accordance with the design information stored within the GERBER file 752. For example, the GERBER file 752 may be uploaded to one or more machines to perform various steps of a PCB production process. The PCB 756 may be populated with electronic components including the package 740 to form a representative printed circuit assembly (PCA) 758.

The PCA 758 may be received at a product manufacture process 760 and integrated into one or more electronic devices, such as a first representative electronic device 762 and a second representative electronic device 764. For example, the first representative electronic device 762, the second representative electronic device 764, or both, may include or correspond to the device 600 of FIG. 6. As an illustrative, non-limiting example, the first representative electronic device 762, the second representative electronic device 764, or both, may include a communications device, a fixed location data unit, a mobile location data unit, a mobile phone, a cellular phone, a satellite phone, a computer, a tablet, a portable computer, or a desktop computer, into which the semiconductor device 100 of FIG. 1, the semiconductor device 250 of FIG. 2, the semiconductor device 350 of FIG. 3, the semiconductor device 698 of FIG. 6, a semiconductor device formed according to the method 400 of FIG. 4, or a combination thereof, is integrated. Alternatively or additionally, the first representative electronic device 762, the second representative electronic device 764, or both, may include a set top box, an entertainment unit, a navigation device, a personal digital assistant (PDA), a monitor, a computer monitor, a television, a tuner, a radio, a satellite radio, a music player, a digital music player, a portable music player, a video player, a digital video player, a digital video disc (DVD) player, a portable digital video player, any other device that includes a processor or that stores or retrieves data or computer instructions, or a combination thereof, into which the semiconductor device 100 of FIG. 1, the semiconductor device 250 of FIG. 2, the semiconductor device 350 of FIG. 3, the semiconductor device 698 of FIG. 6, a semiconductor device formed according to the method 400 of FIG. 4, or a combination thereof, is integrated. As another illustrative, non-limiting example, one or more of the electronic devices 762 and 764 may include remote units, such as mobile phones, hand-held personal communication systems (PCS) units, portable data units such as personal data assistants, global positioning system (GPS) enabled devices, navigation devices, fixed location data units such as meter reading equipment, any other device that includes a processor or that stores or retrieves data or computer instructions, or any combination thereof. Although FIG. 7 illustrates remote units according to teachings of the disclosure, the disclosure is not limited to these illustrated units. Embodiments of the disclosure may be suitably employed in any device which includes active integrated circuitry including memory and on-chip circuitry.

A device that includes the semiconductor device 100 of FIG. 1, the semiconductor device 250 of FIG. 2, the semiconductor device 350 of FIG. 3, the semiconductor device 698 of FIG. 6, a semiconductor device formed according to the method 400 of FIG. 4, or a combination thereof, may be fabricated, processed, and incorporated into an electronic device, as described in the illustrative process 700. One or more aspects of the embodiments disclosed with respect to FIGS. 1-6 may be included in FIG. 7 at various processing stages, such as within the library file 712, the GDSII file 726 (e.g., a file having a GDSII format), and the GERBER file 752 (e.g., a file having a GERBER format), as well as stored at the memory 710 of the research computer 706, the memory 718 of the design computer 714, the memory 750 of the computer 746, the memory of one or more other computers or processors (not shown) used at the various stages, such as at the board assembly process 754, or a combination thereof. Additionally or alternatively, one or more aspects of the embodiments disclosed with respect to FIGS. 1-6 may be included in FIG. 7 by being incorporated into one or more other physical embodiments such as the mask 732, the die 736, the package 740, the PCA 758, other products such as prototype circuits or devices (not shown), or any combination thereof. Although various representative stages of production from a device design to a final product are depicted, in other embodiments fewer stages may be used or additional stages may be included. Similarly, the process 700 may be performed by a single entity or by one or more entities performing various stages of the process 700.

Although one or more of FIGS. 1-7 may illustrate systems, apparatuses, and/or methods according to the teachings of the disclosure, the disclosure is not limited to these illustrated systems, apparatuses, and/or methods. One or more functions or components of any of FIGS. 1-7 as illustrated or described herein may be combined with one or more other portions of another function or component of FIGS. 1-7. Accordingly, no single embodiment described herein should be construed as limiting and embodiments of the disclosure may be suitably combined without departing from the teachings of the disclosure.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. For example, a storage medium may be coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A semiconductor device comprising:
   an active area;
   a first set of conductive vias, the first set of conductive vias formed by a first lithography process, wherein a first distance of each via of the first set of conductive vias to the active area is greater than or equal to a threshold distance, and wherein the active area is a closest active area to each via of the first set of conductive vias; and
   a second conductive via formed by an electron-beam (e-beam) process, wherein a second distance from the second conductive via to the active area is less than or equal to the threshold distance.

2. The semiconductor device of claim 1, wherein the second conductive via has a first resolution that is greater than a second resolution of at least one via of the first set of conductive vias.

3. The semiconductor device of claim 1, wherein the active area includes a U-shaped portion defined by at least a first edge and a second edge, wherein an intersection of the first edge and the second edge is substantially perpendicular.

4. The semiconductor device of claim 1, further comprising:
an active area formed by the first lithography process; and
a contact formed by the e-beam process, wherein the contact is coupled to the active area.

5. The semiconductor device of claim 1, wherein the second conductive via is associated with first margins that are less than second margins associated with the first set of conductive vias.

6. The semiconductor device of claim 1, wherein the threshold distance is based on a design rule of the first lithography process.

7. The semiconductor device of claim 1, wherein the first lithography process comprises an optical lithography process.

8. The semiconductor device of claim 1, wherein the first lithography process comprises a 193 nanometer (nm) immersion (193i) process or an extreme ultraviolet (EUV) process.

9. The semiconductor device of claim 1, wherein the threshold distance corresponds to a spacing margin associated with the first lithography process.

10. The semiconductor device of claim 1, wherein the threshold distance comprises a threshold lateral distance, a threshold height distance, or a threshold diagonal distance.

11. The semiconductor device of claim 1, wherein the threshold distance corresponds to a distance between a particular conductive via and the active area.

12. The semiconductor device of claim 3, further comprising a plurality of lines, the plurality of lines including an active line, a first line, and a second line, wherein the active line is adjacent to the first line and the second line, wherein the U-shaped portion of the active area includes a first portion, a second portion, and a third portion, wherein the first portion is substantially aligned with the first line, wherein the second portion is substantially aligned with the second line, and wherein the third portion is substantially perpendicular to the active line.

13. The semiconductor device of claim 12, wherein a first distance between the first line and the active line is substantially the same as a second distance between the second line and the active line, wherein the third portion is substantially perpendicular to the first portion and the second portion, and wherein a midpoint of the third portion is substantially aligned with the active line.

14. The semiconductor device of claim 1, further comprising a contact coupled to the active area, wherein the contact is formed by the e-beam process.

15. The semiconductor device of claim 14, wherein a corner of the contact has less corner rounding than a corner of each via of the first set of conductive vias.

16. The semiconductor device of claim 1, wherein a corner of the second conductive via has less corner rounding than a corner of each of the first set of conductive vias, and wherein the active area is a closest active area to the second conductive via.

17. The semiconductor device of claim 4, wherein the contact comprises a source contact or a drain contact, and wherein the contact includes a contact pad.

18. The semiconductor device of claim 1, further comprising:
a plurality of active areas arranged along a first axis, the plurality of active areas including the active area; and
a plurality of metal lines arranged substantially perpendicular to the first axis.

19. The semiconductor device of claim 18, wherein the second conductive via is in contact with a corresponding metal line of the plurality of metal lines.

20. The semiconductor device of claim 19, wherein the second conductive via is positioned between a first conductive via of the first set of conductive vias and a second conductive via of the first set of conductive via.

21. The semiconductor device of claim 20, wherein each via of the first set of conductive vias is in contact with a corresponding metal line of the plurality of metal lines.

22. The semiconductor device of claim 1, wherein the active area includes a diffusion area corresponding to a source, a drain, a channel, or a combination thereof, of a transistor.

23. The semiconductor device of claim 1, wherein the second conductive via is included in a second set of conductive vias, and wherein the second set of conductive vias includes one or more conductive vias.

24. An apparatus comprising:
first means for conducting first electrical signals, the first means for conducting formed by a first lithography process, wherein a first distance from the first means for conducting to an active area is greater than or equal to a threshold distance, wherein the active area is a closest active area to the first means for conducting; and
second means for conducting second electrical signals, the second means for conducting formed by an e-beam process, wherein a second distance from the second means for conducting to the active area is less than or equal to the threshold distance.

25. The apparatus of claim 24, wherein the first means for conducting comprises a first set of via structures.

26. The apparatus of claim 24, wherein the second means for conducting comprises a second via structure.

27. The apparatus of claim 24, wherein the first electrical signals include voltage signals, current signals, or both, and wherein the second electrical signals include voltage signals, current signals, or both.

28. The apparatus of claim 24, wherein the first means for conducting and the second means for conducting are included in semiconductor device.

29. The apparatus of claim 24, further comprising a third means for conducting third electrical signals, the third means for conducting formed by the first lithography process, wherein a third distance from the third means for conducting to the active area is greater than or equal to a threshold distance.

30. The apparatus of claim 29, wherein the first distance is substantially the same as the third distance.

* * * * *